United States Patent [19]

Ono

[11] Patent Number: 6,104,059
[45] Date of Patent: Aug. 15, 2000

[54] NON-VOLATILE MEMORY HAVING A SILICIDE FILM ON MEMORY CONTROL GATES AND PERIPHERAL CIRCUIT TRANSISTOR GATES

[75] Inventor: Takashi Ono, Tokyo, Japan

[73] Assignee: Oki Electric Industry Co., Ltd., Tokyo, Japan

[21] Appl. No.: 09/229,993

[22] Filed: Jan. 14, 1999

[30]  Foreign Application Priority Data

Jan. 16, 1998 [JP] Japan .................................. 10-006485
Oct. 2, 1998 [JP] Japan .................................. 10-281216

[51] Int. Cl.[7] .......................... H01L 29/76; H01L 29/788; H01L 29/792
[52] U.S. Cl. .......................... 257/320; 257/314; 257/315; 257/316; 257/319; 257/321; 257/326; 257/754; 257/755; 257/756; 257/757; 257/758; 257/759; 257/760
[58] Field of Search ................................... 257/320, 314, 257/315, 321, 754, 755, 756–760, 316, 319, 326

[56]  References Cited

U.S. PATENT DOCUMENTS

| | | | |
|---|---|---|---|
| 4,356,622 | 11/1982 | Widmann | 29/571 |
| 4,978,637 | 12/1990 | Liou et al. | 437/193 |
| 5,654,219 | 8/1997 | Huber et al. | 438/593 |
| 5,742,088 | 4/1998 | Pan et al. | 257/382 |
| 5,789,294 | 8/1998 | Choi | 438/258 |
| 5,801,399 | 9/1998 | Hattori et al. | 257/69 |
| 5,861,650 | 1/1999 | Maeda et al. | 438/258 |
| 5,877,523 | 3/1999 | Liang | 257/315 |
| 5,879,990 | 3/1999 | Dormans et al. | 257/316 |
| 5,888,870 | 3/1999 | Gardner et al. | 438/261 |

FOREIGN PATENT DOCUMENTS 6-177360  6/1994  Japan .

OTHER PUBLICATIONS

Y. Takeuchi et al., "A Self–Aligned STI Process Integration for Low Cost and Highly Reliable 1Gbit Flash Memories," 1998 Symposium on VLSI Technology Digest of Technical Papers, pp. 102 and 103.

*Primary Examiner*—David Hardy
*Assistant Examiner*—Matthew E. Warren
*Attorney, Agent, or Firm*—Jones Volentine, LLP

[57]  ABSTRACT

In a non-volatile memory, memory cells have respective floating gates formed of a first polysilicon and respective control gates formed of a second polysilicon. Further, in the non-volatile memory, peripheral circuits include transistors having respective gates formed of the first polysilicon. In addition, a silicide layer is formed directly on the control gates of the memory cells and directly on the gates of the transistors.

3 Claims, 10 Drawing Sheets

NON-VOLATILE MEMORY HAVING A SILICIDE FILM ON MEMORY CONTROL GATES AND PERIPHERAL CIRCUIT TRANSISTOR GATES

BACKGROUND OF THE INVENTION

1. Field of the Invention

The present invention relates to hybrid elements of an electrically writable non-volatile memory and a DRAM and other elements such as a Logic IC, etc.

2. Description of the Related Art

Conventionally, in a non-volatile memory such as a flash memory having floating gates and control gates, a gate oxidation film below the floating gates (hereinafter referred to as a first oxidation film) is used as an oxidation film for memory cell transistors, and information is stored by causing a threshold value of a memory cell transistor to change as a result of removing or injecting electrical charge into the floating gate using CHE (channel Hot Electron) current or FN (Fowler-Nordheim) tunnel current by applying a high voltage to the first gate oxidation film.

It is required that the film thickness of the first gate oxidation film in the memory cell transistor is thin, for example 100 Å, so as to carry out rewriting. However, even if a gate oxidation film as thin as, for example, 100 Å is used underneath the floating gate of the memory cell, if a capacitive coupling ratio between the control gates and the floating gates is assumed to be 0.7 then a voltage required for rewriting becomes 10V or more. If the first gate oxidation film is used directly on peripheral transistors, an electric field applied to the oxidation film becomes 10MV/cm and it is not possible to ensure the reliability of the oxidation film.

As a result, a gate oxidation film thicker than an ordinary first gate oxidation film is applied to peripheral transistors. Specifically, a common manufacturing method forms peripheral transistors with a gate oxidation film of approximately 200 Å, and to with electrodes of the same material as control gates of memory cell transistors.

In the example of the related art described thus far, the case has been described where only one type of gate oxidation film is used for peripheral circuits, namely a gate oxidation film with a thickness of 200 Å. However, there are also cases where transistors are formed having gate oxidation films of differing thicknesses, such as those for high withstand pressure or low voltage use. As such a manufacturing method, there is a method of respectively forming two types of gate oxidation film separately for transistors of peripheral circuits and transistors of memory cells, as disclosed in, for example, Japanese Patent Laid-open Publication No. Hei. 6-177360.

However, with the above described method, since it is necessary to respectively form two types of gate oxidation film for the memory cells and separate portions, there is a problem that the number of manufacturing steps is increased compared to a method where one only type of gate oxidation film is formed for the memory cells and other portions.

SUMMARY OF THE INVENTION

An object of the present invention is to provide a non-volatile memory in which there is no need to form two types of gate oxidation films for memory cells and separate portions, and in which gates of transistors of peripheral circuits have low resistance, and to provide a method of manufacturing the same.

The non-volatile memory of the present invention comprises memory cells having floating gates formed of first polysilicon and control gates formed of second polysilicon formed directly on top of a silicide layer, and peripheral circuits provided with transistors having gates formed of the first polysilicon formed directly on a silicide layer.

Also, the method of manufacturing the non-volatile memory having memory cells comprised of floating gates formed of first polysilicon and control gates formed of a second polysilicon comprises the steps of: forming a first oxidation film on a semiconductor substrate, forming a first polysilicon film on the first oxidation film, forming an insulating film on the first polysilicon film, forming a second polysilicon film on the insulating film, selectively removing the insulating film and the second polysilicon film at specified regions for forming transistors, forming a silicide layer on the second polysilicon film and on fixed regions of the first polysilicon film for forming transistors, and respectively patterning floating gates and control gates of transistors and memory cells.

BRIEF DESCRIPTION OF THE DRAWINGS

While the specification concludes with claims particularly pointing out and distinctly claiming the subject matter which is regarded as the invention, it is believed that the invention, the objects and features of the invention and further objects features and advantages thereof will be better understood from the following description taken in connection with the accompanying drawings in which:

DESCRIPTION OF THE PREFERRED EMBODIMENTS

Figure 1A:
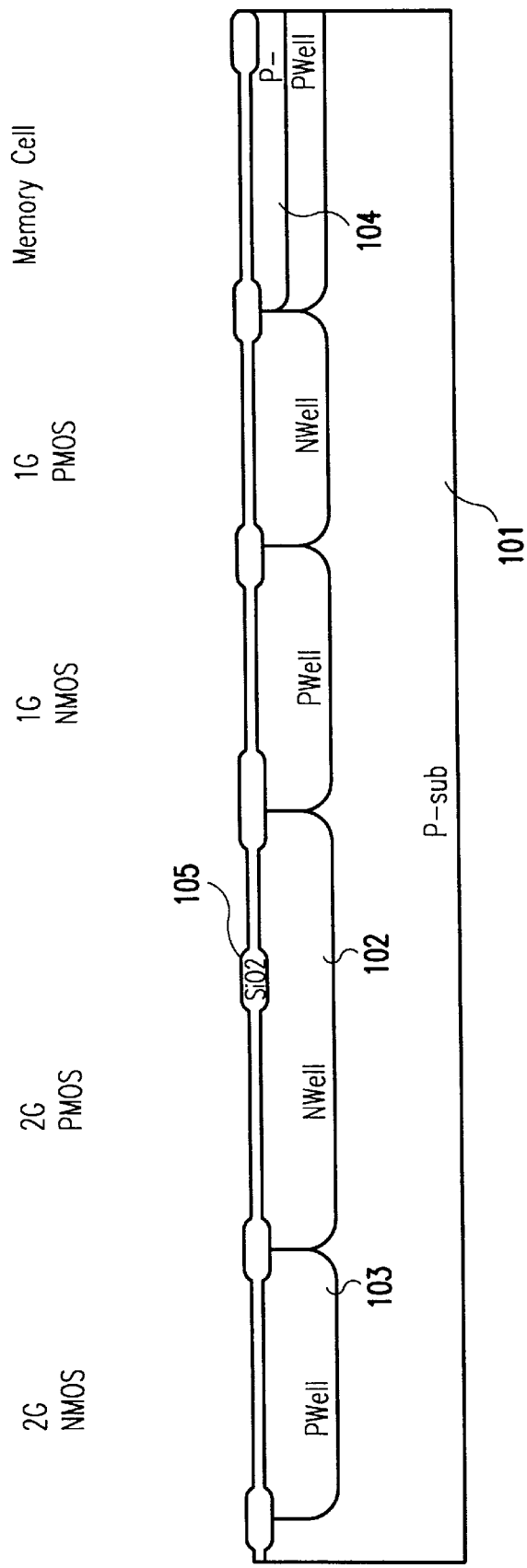
FIGS. 1(a)–(d) show manufacturing steps of the present invention.
Figure 1B:
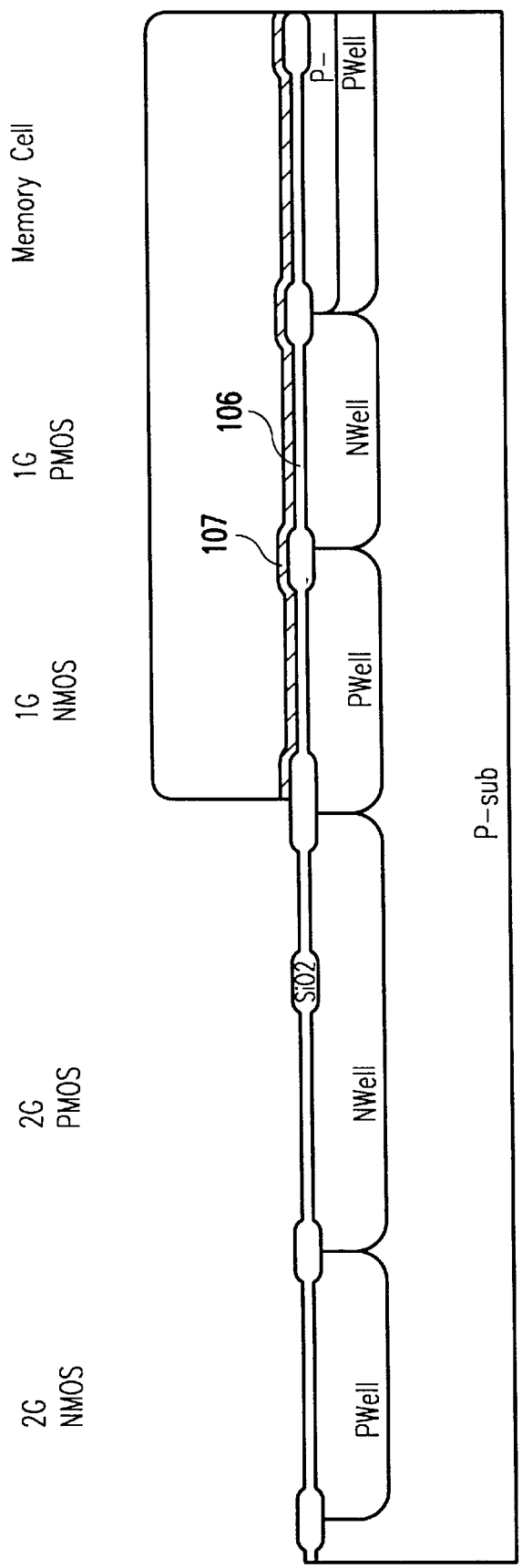

A manufacturing process of a first embodiment of the present invention will be described in detail using FIG. 1 and FIG. 2. First of all, an N-well 102, P-well 103, element separators 105 and memory cell channels 104 are formed on a P-type Si substrate 101 (FIG. 1(a)). Next, ion injection is carried out to adjust the Vt of the memory cells. At the same time, although not shown in the drawings, ion injection is carried out at a dosage amount that is different from that for the memory cells for Vt control of peripheral circuits (1G NMOS/PMOS in the drawings) using the first polysilicon film as gate electrodes. A first gate oxidation film 106 is then formed using a thermal oxidation method over the entire surface of the substrate to a thickness of approximately 100 Å, constituting places for tunnel current of the memory cells to flow. After that, the first polysilicon film 107 is deposited to 1000 Å and impurities such as phosphor are injected. Next, regions of the first polysilicon film and the first oxidation film corresponding to the peripheral circuits using the second polysilicon film 111 as gate electrodes (2G NMOS/PMOS in the drawings) are removed (FIG. 1(b)).

Subsequently, an IPD (Inter Poly Dielectric) insulating film 109 constituted by, for example, an ONO 3 layer insulating film, is formed on the memory cells and regions for the peripheral circuits (1G NMOS/PMOS in the drawings) using the first polysilicon film 107 as gate electrodes. Also, at the time of forming the IPD insulating film, heat processing is carried out at a temperature close to 1000°

C. for improving film quality. Following that, a second gate oxidation film 110 is formed to a thickness of 200 Å on regions for the peripheral circuits using the second polysilicon film 111 as gate electrodes (2G NMOS/PMOS in the drawings). Next, the second polysilicon film is deposited to a thickness of 1000 Å and injected with impurities such as phosphor.

A resist 201 is then subjected to patterning so as to expose regions for the peripheral circuits (1G NMOS/PMOS in the drawings) using the first polysilicon film 107 as gate electrodes. After that, with the resist 201 as a mask, regions of the second polysilicon film 111 and the IPD insulating film 109 for the peripheral circuits (1G NMOS/PMOS in the drawings) using the first polysilicon film 107 as gate electrodes are etched, so as to expose the first polysilicon film 107.

Figure 1C:
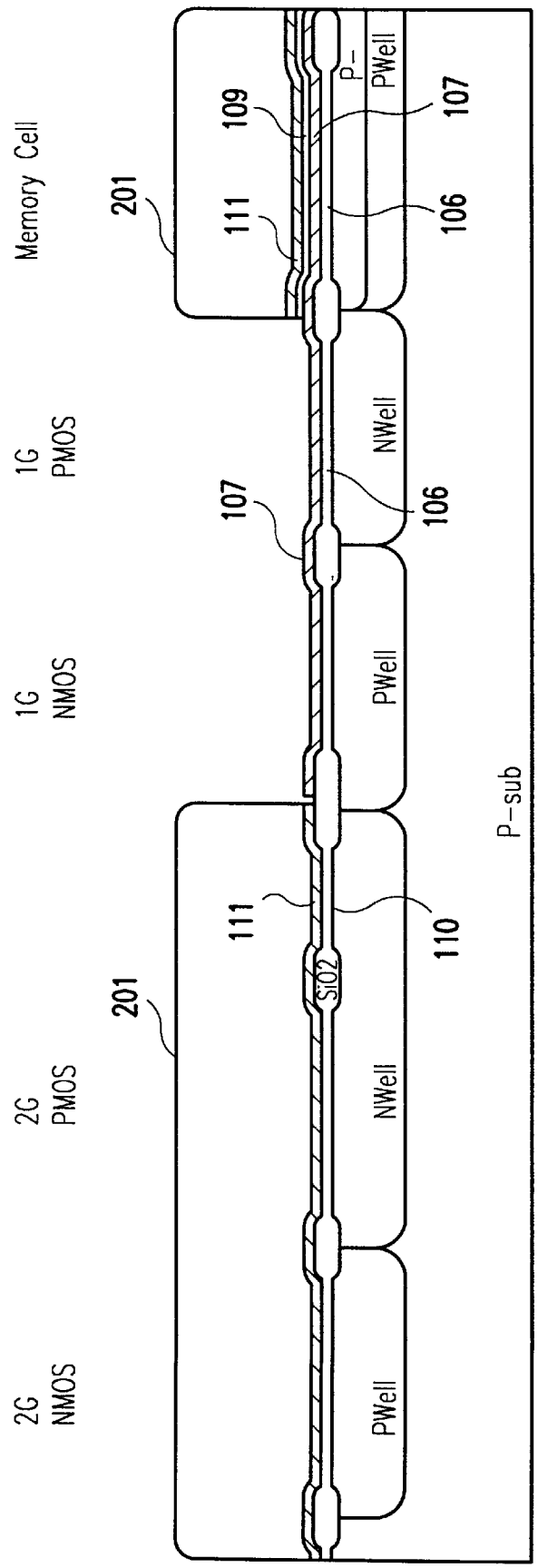

Accordingly, the outermost surfaces are the second polysilicon 111 at regions for the peripheral circuits using the second polysilicon film 111 as gate electrodes (2G NMOS/PMOS in the drawings) and regions for the memory cells, and the first polysilicon 107 at regions for the peripheral circuits (1G NMOS/PMOS in the drawings) using the first polysilicon film 107 as gate electrodes (FIG. 1(c)).

Figure 1D:
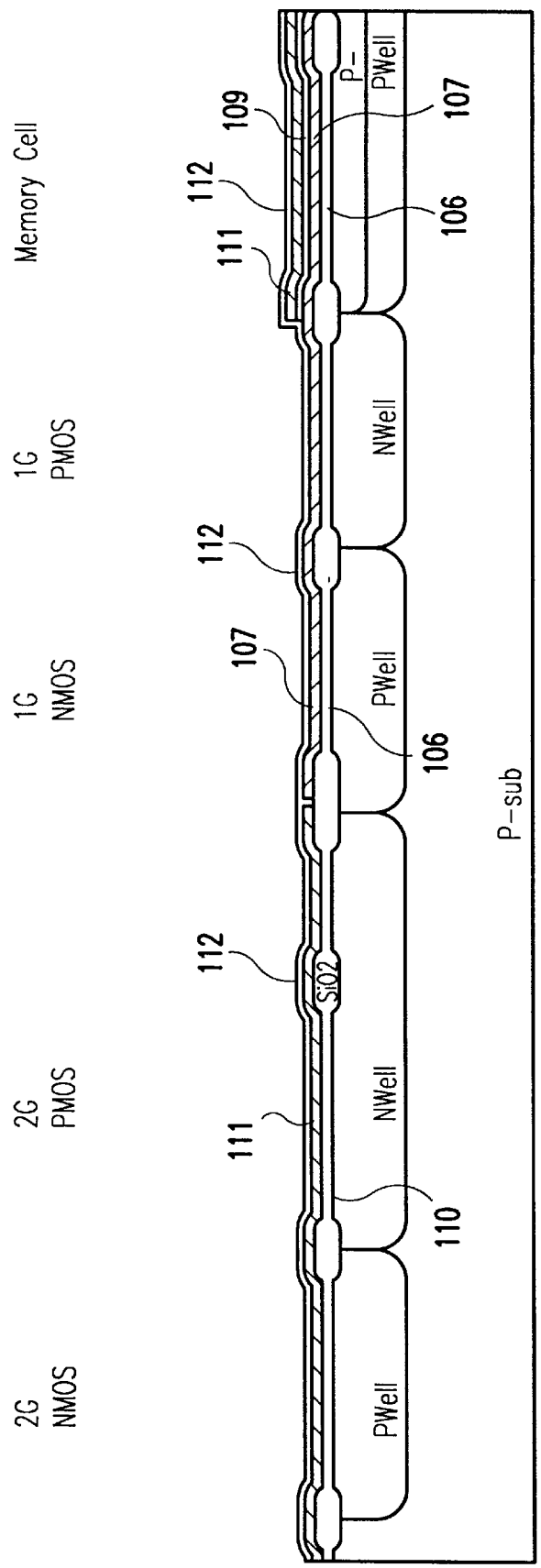
Figure 2E:
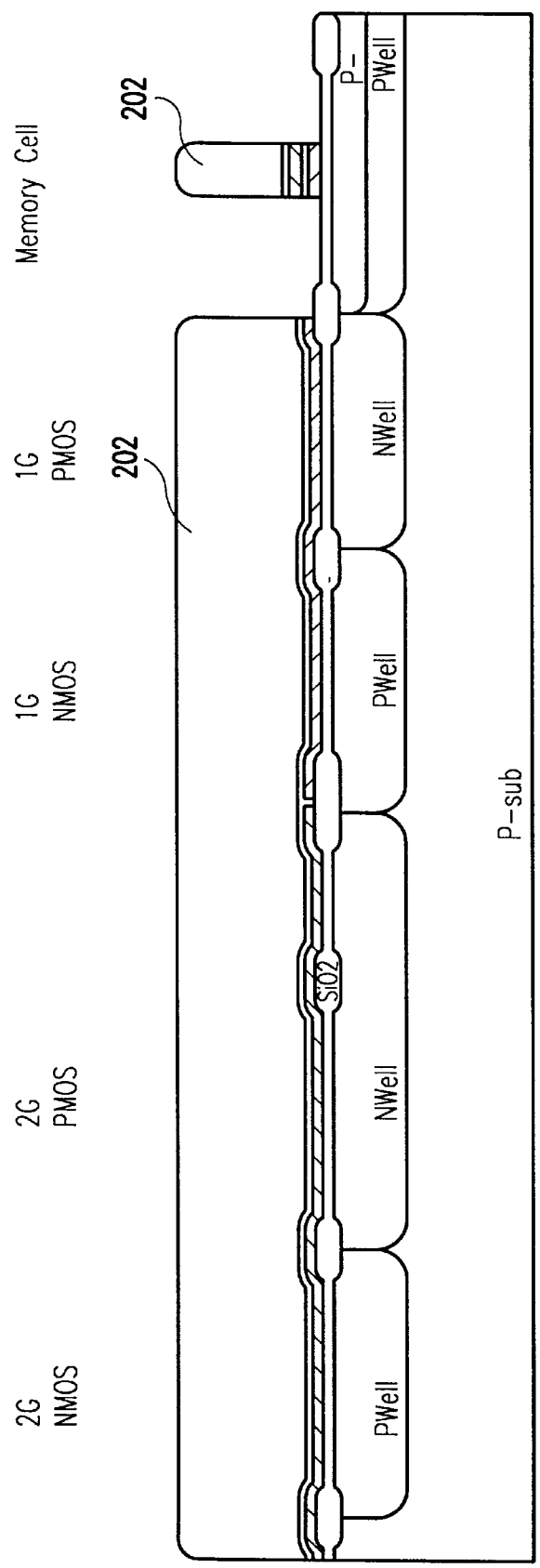
FIGS. 2(e)–(h) show manufacturing steps of the present invention.
Figure 2F:
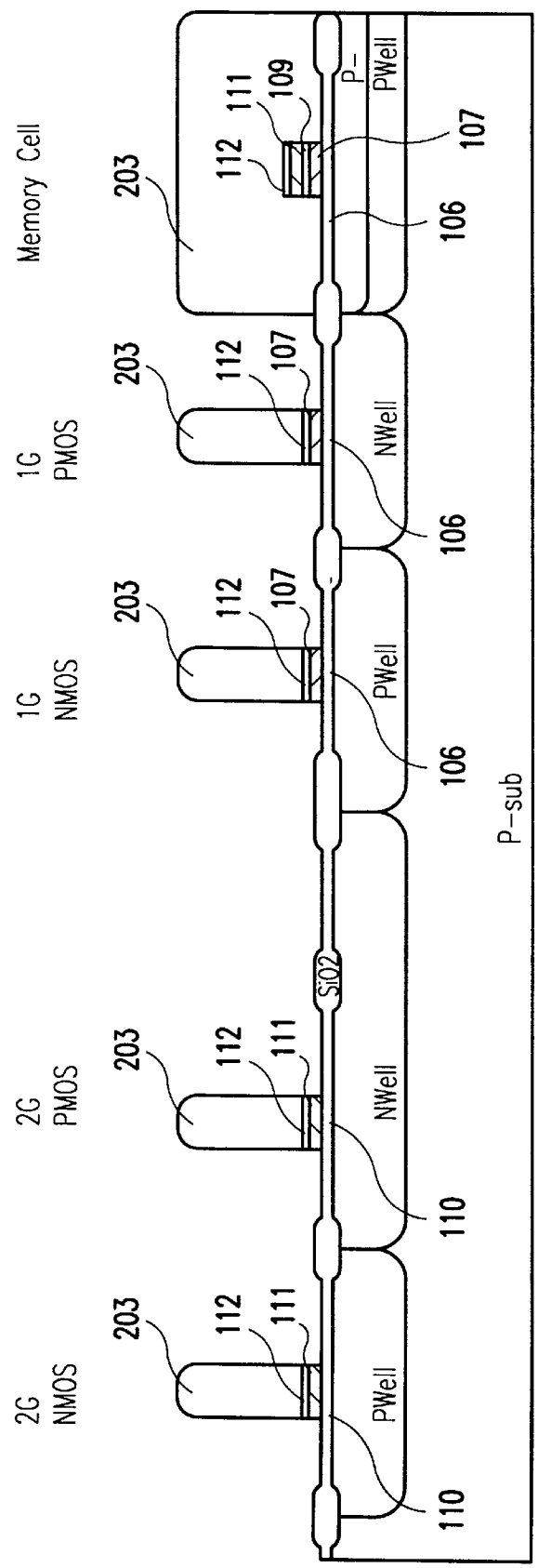
Figure 2G:
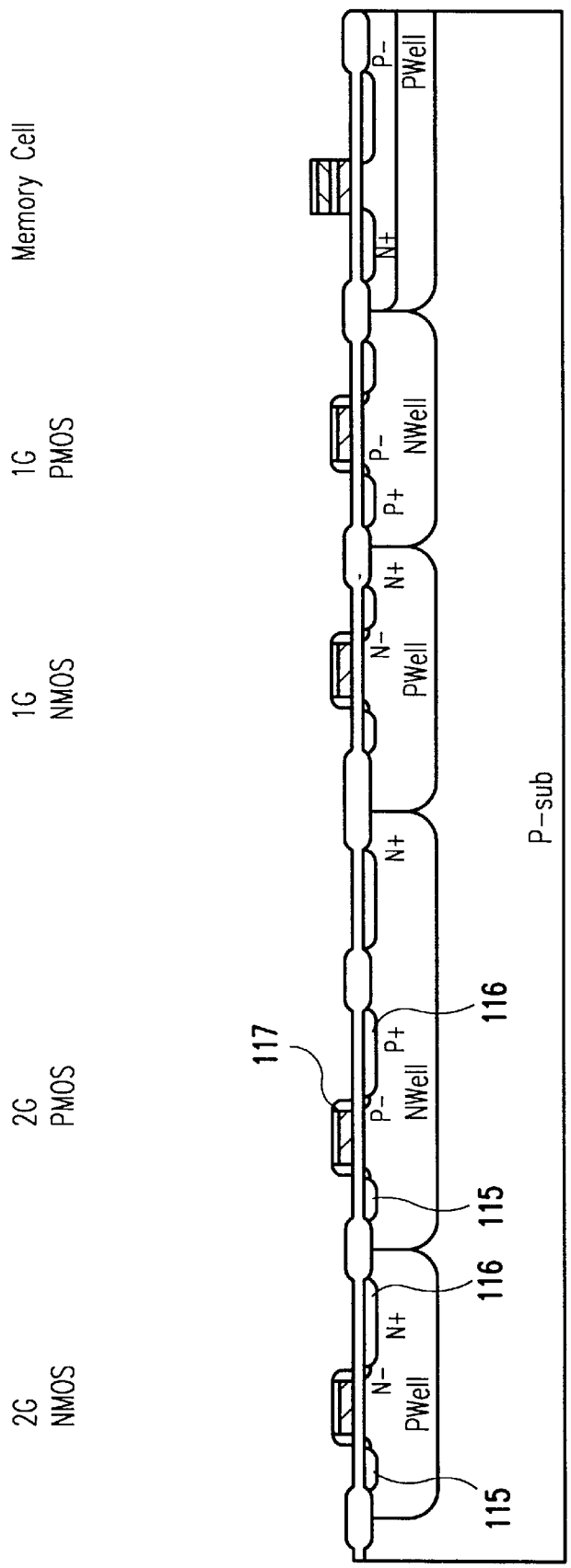
Figure 2H:
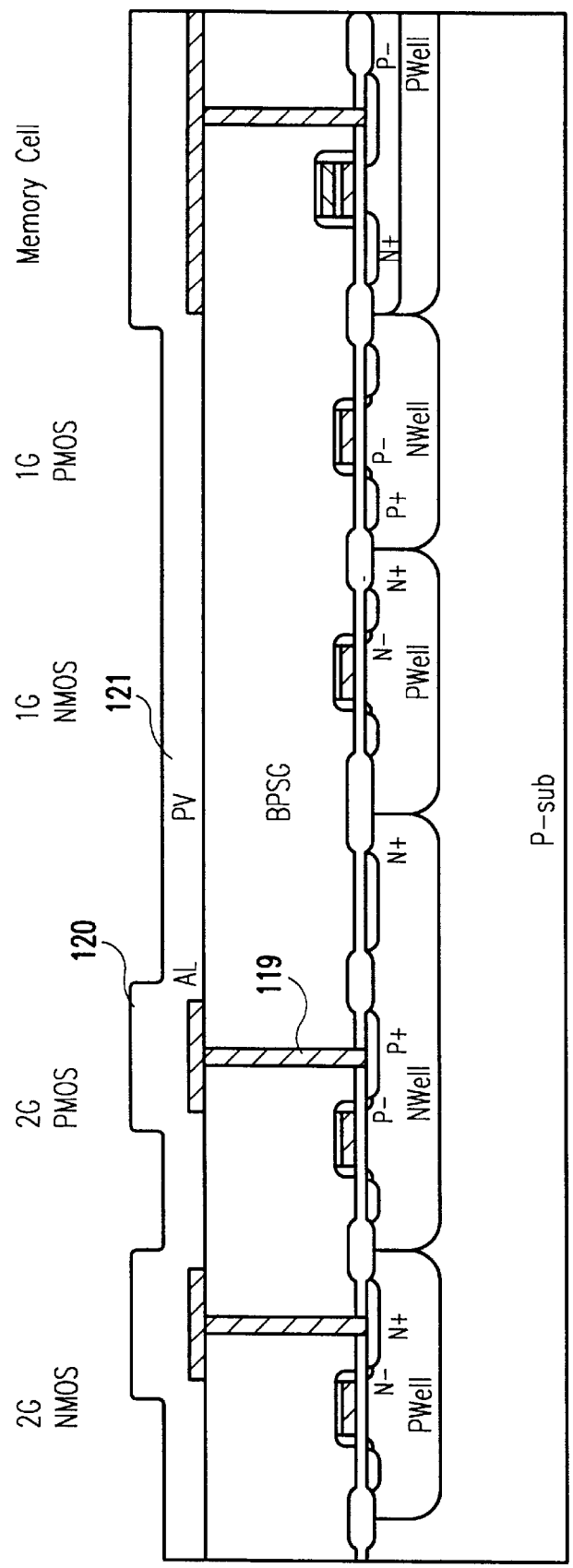

A silicide film 112 is then formed to a thickness of 1500 Å on the entire surface of the substrate (FIG. 1(d)). Following that, each of the films, namely the silicide film of the memory cell portion 112, the second polysilicon film 111, the IPD insulating film 109 and the first polysilicon film 107 are etched in a self-aligned manner with the resist pattern 202 as a mask. At this time, regions for the peripheral circuits (2G NMOS/PMOS in the drawings) using the second polysilicon film 111 as gate electrodes and regions for the peripheral circuits (1G NMOS/PMOS in the drawings) using the first polysilicon film 107 as gate electrodes are covered by the resist 202 (FIG. 2(e)).

Next, with the resist 203 as a mask, portions of the peripheral circuits (2G NMOS/PMOS in the drawings) using the second polysilicon film 111 as gate electrodes and portions of the peripheral circuits (1G NMOS/PMOS in the drawings) using the first polysilicon film 107 as gate electrodes are simultaneously etched to form gate electrodes of the peripheral circuits. At this time, memory cell regions are covered by the resist 203. Also, the films to be etched are the silicide film 112 and the second polysilicon film 111 at parts of the peripheral circuits (2G NMOS/PMOS in the drawings) using the second polysilicon film 111 as gate electrodes, and the silicide film 112 and the first polysilicon film 107 at parts of the peripheral circuits (1G NMOS/PMOS in the drawings) using the first polysilicon film 107 as gate electrodes (FIG. 1(f)).

Following that, source/drain diffusion films are formed. A side wall 117 is also formed if an LDD structure is required (FIG. 2(g)). Next, aBPSG film is deposited as an intermediate insulating film, contact hole openings and metal 119 to the contact holes are embedded. Further, aluminum wiring is formed and the surface is protected by a passivation layer 121, to thus complete wafer processing (FIG. 2(h)).

Figure 3:
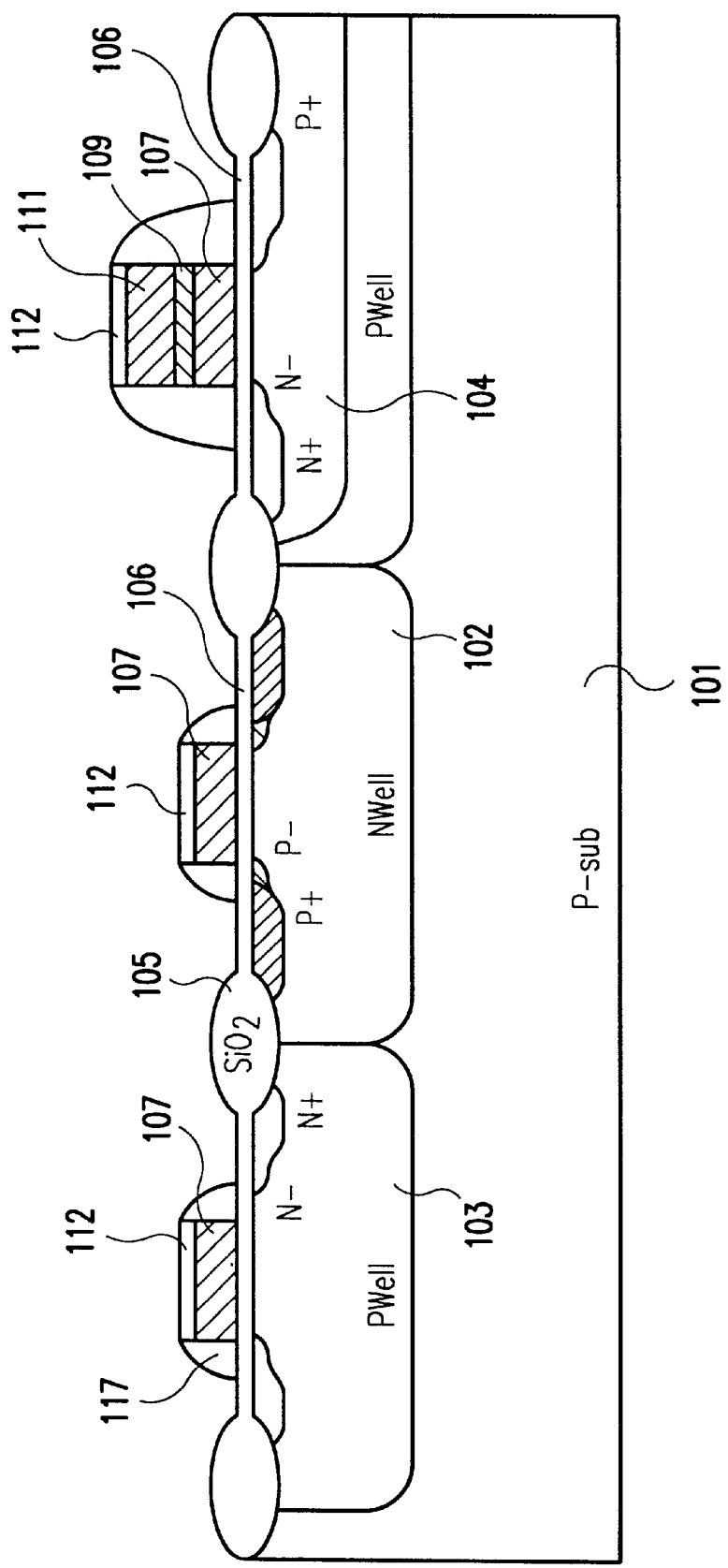
FIG. 3 is an enlarged view of a memory cell and peripheral circuit of the present invention.

FIG. 3 is an enlarged view of the memory cells and peripheral circuits (1G NMOS/PMOS in the drawings) using the first polysilicon film 107 as gate electrodes. The gate oxidation film of the peripheral circuits (1G NMOS/PMOS in the drawings) using the first polysilicon film 107 as gate electrodes uses the first gate oxidation film 106 of the memory cells. Also, a silicide film 112 is formed directly on the second polysilicon film for the memory cells and directly on the first polysilicon film 107 for the peripheral circuits (1G NMOS/PMOS in the drawings). Specifically, the memory cells are constructed from the first gate oxidation film 106, the first polysilicon film 107, the IPD insulation film 109, the second polysilicon film 111 and the silicide film 112. The peripheral circuits (1G NMOS/PMOS in the drawings) are constructed from the first gate oxidation film 106, the first polysilicon film 107, the silicide film 112 and the source/drain diffusion films. The peripheral circuits have an LDD structure, but are not thus limited.

In the first embodiment of the present invention as described above, compared to the method of forming a gate oxidation film of one thickness for transistors of the peripheral circuits, it is possible to form gate oxidation films of differing thicknesses for the transistors of the peripheral circuits without increasing heat processing steps. Also, since regions of the second polysilicon film 111 and the IPD insulation film for the peripheral circuits (1G NMOS/PMOS in the drawings) using the first polysilicon film 107 as gate electrodes are selectively removed and a silicide film 112 is formed directly on the first polysilicon film 107, more stable electrical connection within electrodes is possible because of the natural oxidation film reduction function of the silicide film 112.

Further, with the resist 203 as a mask, even in the case where the peripheral circuits (2G NMOS/PMOS in the drawings) using the second polysilicon film 111 as gate electrodes and the peripheral circuits (1G NMOS/PMOS in the drawings) using the first polysilicon film 107 as gate electrodes are simultaneously etched, the problem of over etching or under etching is also solved when the film thickness of the first polysilicon film 107 and the second polysilicon film 111 are almost the same.

A second embodiment of the present invention will now be described. Points that are the same as in the first embodiment have been described in detail above, so further description thereof will be omitted. Description will be given in the following of parts that are different from the first embodiment.

The second embodiment of the present invention, as shown in FIG. 1(c), comprises removing the second polysilicon film 111 and the IPD insulating film 109 with the resist 201 as a mask, and after that injection of ions is carried for controlling Vt of the peripheral circuits (1G NMOS/PMOS in the drawings) using the first polysilicon film 107 as gate electrodes with the resist 201 unaltered as a mask.

According to the above described second embodiment of the present invention, prior to ion injection for controlling Vt, the heat processing at the time of forming the insulation film 109 has also been completed and a comparatively low applied energy can be selected so as to enable ions to pass through the first polysilicon film of approximately 1000 Å, which means that a concentration distribution in the depth direction of the peripheral circuits (1G NMOS/PMOS in the drawings) using the first polysilicon film 107 as gate electrodes can be finely controlled.

A third embodiment of the present invention will now be described. Points that are the same as in the first embodiment have been described in detail above, so further description thereof will be omitted. Description will be given in the following of parts that are different from the first embodiment.

In FIG. 1(c) of the third embodiment, after formation of the first polysilicon film 107, the phosphor concentration within the polysilicon film 107 is set to a concentration that just prevents a depletion layer, for example a low value of $2 \times 10^{20}$ [cm$^{-3}$]. Next, after removal of the second polysilicon film 111 and the IPD insulation film 109 by etching, phosphor or arsenic is ion injected at a low energy of, for example, 10 KeV using the resist 201 as a mask, so as to increase the impurity concentration within the first polysilicon film 107.

According to the above described third embodiment, the impurity concentration within the first polysilicon film 107 is set to a level that prevents a depletion layer in an initial step, and after completion of heat processing at the time of forming the IPD insulation film 109 ion injection is carried out to increase the impurity concentration within the first polysilicon film 107. This means that there is no degradation in film quality caused by impurities being diffused in the first gate oxidation film 106, and a depletion layer cannot be formed within the first polysilicon film 107 even if there is diffusion of impurities in to the silicide film 112. Also, Since the resist 201 at the time of removing the second polysilicon film and the IPD insulating film 109 can be used as it is, there is no need for an additional photolithography step, and processing can be completed with the addition of only one ion injection step.

A fourth embodiment of the present invention will now be described. Points that are the same as in the first to third embodiments have been described in detail above, so further description thereof will be omitted.

Figure 4:
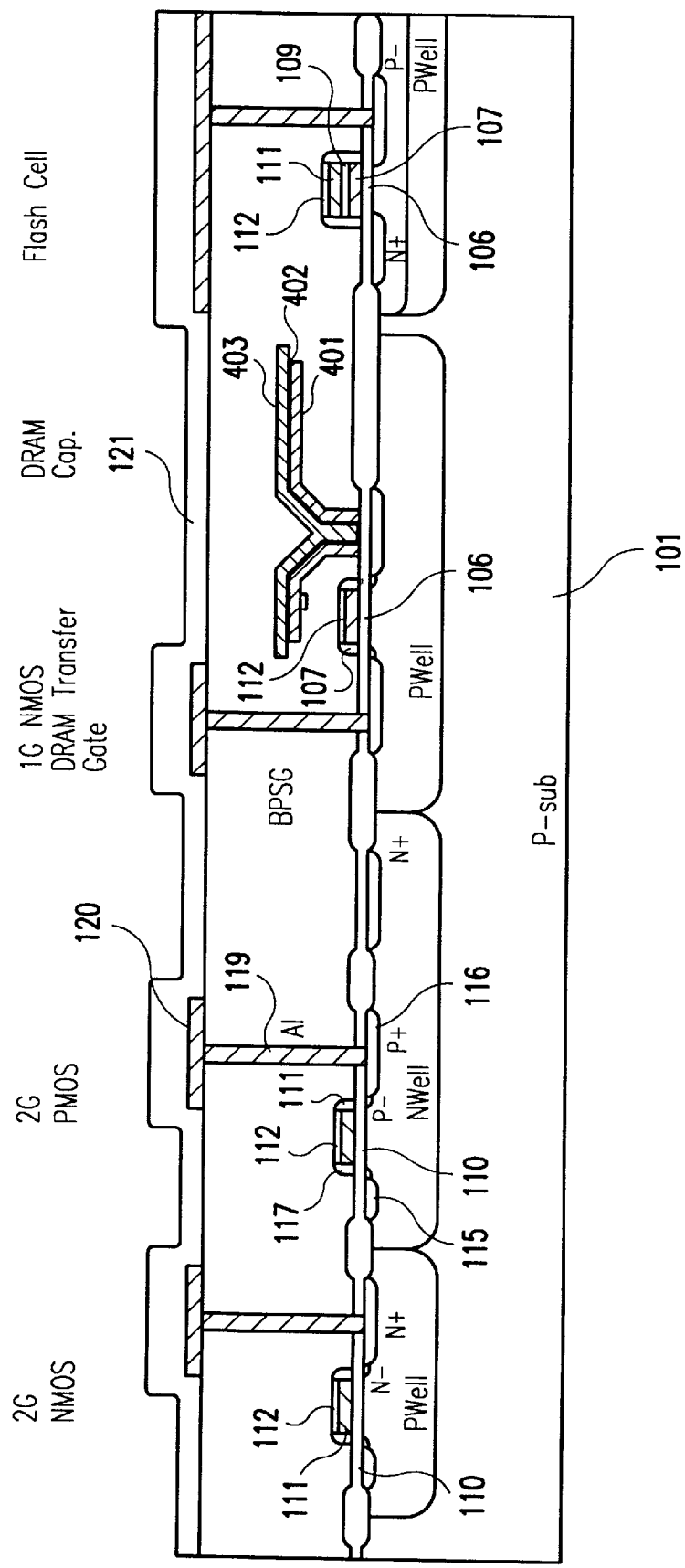
FIG. 4 shows a fourth embodiment of the present invention.

The fourth embodiment is applied to a hybrid processor comprising flash memory of the first to third embodiments and DRAM. In FIG. 4, peripheral circuits (2G NMOS/PMOS in the drawings) having a gate oxidation film with a thickness of approximately 200 Å and using a second polysilicon film 111 as gate electrodes are used as transistors for flash memory. Also, peripheral circuits (1G NMOS in the drawings) having a gate oxidation film with a thickness of 100 Å and using a first polysilicon film 107 as gate electrodes are used as transistors for DRAM.

Here, gate electrodes of the transistors for flash memory (2G NMOS/PMOS in the drawings) are formed as a polycide film comprising a second polysilicon film 111 and a silicide film 112 formed using the same steps as in the first to third embodiments. Further, the electrodes of the transistors for DRAM (1G NMOS in the drawings) are formed as a polycide film comprising a first polysilicon film 107 and the silicide film 112 formed using the same steps as in the first to third embodiments.

In the fourth embodiment, as additions to the first to third embodiments, DRAM capacitors are formed after formation of sources and drains of the DRAM transistors (1G NMOS in the drawings). The capacitors are constructed of sequentially formed polysilicon film 401, insulating film 402 and polysilicon film 403, as shown in FIG. 4.

According to the above described fourth embodiment, high voltage flash memory transistors and low voltage DRAM transistors can be formed at the same time, and their gate electrodes can be made into polycide and made low resistance without degrading the IPD insulation film 109 of memory cells of the flash memory.

As has been described in detail above, according to the present invention a second polysilicon film 111 and an IPD insulating film 109 are selectively removed using a resist 201 as a mask and a first gate oxidation film 106 and a first polysilicon film 107 of memory cells are used for peripheral circuits, which means that there is no need to form a gate oxidation film for the peripheral circuits in a separate step, a silicide film 112 can be formed directly on the first polysilicon film 107, and a stable electrical connection within electrodes is possible using the natural oxidation reduction function of the silicide film.

Further, according to the present invention, after removal of the second polysilicon film 111 and the IPD insulating film using the resist 201 as a mask, ion injection is carried out to control Vt of the peripheral circuits using the first polysilicon film as a gate oxidation film also using the resist 201 as the mask. Prior to ion injection, heat processing for formation of the IPD insulating film is also completed and it is possible to select a comparatively low acceleration energy as long as ions can pass through the first polysilicon film of approximately 1000 Å thick, which means that it is possible to finely control the concentration distribution of impurities in a depth direction of the peripheral circuit region.

The present invention has been described using illustrative embodiments, but it should be understood that description not restrictive. Various modifications to these illustrative embodiments, as well as other embodiments, will be clear to one skilled in the art upon reference to this description. Accordingly, the appended claims are considered to encompass all such modifications and embodiments as are within the spirit and scope of the present invention.

What is claimed is:

1. A non-volatile memory comprising:
   a memory cell having a floating gate formed of a first polysilicon and a control gate formed of a second polysilicon;
   a peripheral circuit including a first transistor having a first gate formed of the first polysilicon and a second transistor having a second gate formed of the second polysilicon;
   a first oxidation film formed under the first gate of the first transistor;
   a second oxidation film formed under the second gate of the second transistor; and
   a silicide layer formed directly on the control gate of the memory cell and directly on the first and second gates of the first and second transistors, respectively,
   a thickness of the first oxidation film being different than a thickness of the second oxidation film.

2. The non-volatile memory as claimed in claim 1, wherein the first transistor is a DRAM transfer gate.

3. The non-volatile memory as claimed in claim 1, wherein a thickness of the floating gate is approximately equal to a thickness of the control gate.

* * * * *